(12) United States Patent
Zhao et al.

(10) Patent No.: US 11,894,508 B2
(45) Date of Patent: Feb. 6, 2024

(54) SECOND-GENERATION HTS STRIP AND PREPARATION METHOD THEREOF

(71) Applicants: Shanghai Superconductor Technology Co., Ltd., Shanghai (CN); SHANGHAI JIAO TONG UNIVERSITY, Shanghai (CN)

(72) Inventors: Yue Zhao, Shanghai (CN); Donghong Wu, Shanghai (CN); Guangyu Jiang, Shanghai (CN); Chunsheng Cheng, Shanghai (CN); Jiamin Zhu, Shanghai (CN); Wei Wu, Shanghai (CN); Yijun Ding, Shanghai (CN); Zhijian Jin, Shanghai (CN)

(73) Assignees: Shanghai Superconductor Technology Co., Ltd., Shanghai (CN); Shanghai Jiao Tong University, Shanghai (CN)

( * ) Notice: Subject to any disclaimer, the term of this patent is extended or adjusted under 35 U.S.C. 154(b) by 0 days.

(21) Appl. No.: 17/731,236

(22) Filed: Apr. 27, 2022

(65) Prior Publication Data

US 2022/0359810 A1 Nov. 10, 2022

Related U.S. Application Data

(63) Continuation of application No. PCT/CN2021/112263, filed on Aug. 12, 2021.

(30) Foreign Application Priority Data

May 6, 2021 (CN) .......................... 202110491577.7

(51) Int. Cl.
*H01L 39/24* (2006.01)
*H01L 39/14* (2006.01)

(52) U.S. Cl.
CPC ........ *H01L 39/2435* (2013.01); *H01L 39/143* (2013.01)

(58) Field of Classification Search
CPC .......................... H01L 39/2435; H01L 39/143
See application file for complete search history.

(56) References Cited

U.S. PATENT DOCUMENTS

| | | | |
|---|---|---|---|
| 2014/0323314 A1* | 10/2014 | Takemoto | H01L 39/248 505/433 |
| 2017/0145561 A1* | 5/2017 | Farquhar | B32B 3/12 |
| 2019/0062921 A1* | 2/2019 | Adams | H01B 5/002 |

FOREIGN PATENT DOCUMENTS

| CN | 108666044 A | 10/2018 |
|---|---|---|
| CN | 101728018 A | 6/2020 |
| CN | 112349667 A | 2/2021 |

OTHER PUBLICATIONS

CNIPA, Notification of a First Office Action for CN202110491577.7, dated Apr. 18, 2022.

(Continued)

*Primary Examiner* — Paul A Wartalowicz

(57) ABSTRACT

A second-generation high temperature superconducting (HTS) strip and a preparation method thereof are provided. The second-generation HTS strip includes a superconducting strip body and a stabilizing layer arranged thereon. The stabilizing layer is a copper-graphene composite film with a total thickness of 2-30 microns on one side. The superconducting strip may be obtained by the preparation method of: (1) putting a superconducting strip body into a magnetron sputtering reaction chamber, followed by pumping to a high-level vacuum and filling with a working gas; (2) using copper and graphene as targets, and performing a sputter coating by controlling a magnetron sputtering power, to deposit the targets onto at least one surface of the superconducting strip body. The prepared HTS strips containing (Continued)

copper-graphene stabilizing layer with high strength and high conductivity may have 30%-70% higher tensile strength than conventional copper plated superconducting strips, with less than 10% IACS attenuation in conductivity.

4 Claims, 1 Drawing Sheet

(56) References Cited

OTHER PUBLICATIONS

Shanghai Super Conductor Technology Co., Ltd. et al. (Applicants), Reply to Notification of a First Office Action for CN202110491577.7 w/ Replacement (allowed) Claims, dated May 25, 2022.
CNIPA, Notification to grant patent right for invention for CN202110491577.7, dated Jun. 8, 2022.

* cited by examiner

US 11,894,508 B2

SECOND-GENERATION HTS STRIP AND PREPARATION METHOD THEREOF

CROSS-REFERENCE TO RELATED APPLICATION

This application claims priority to Chinese Patent Application No. 2021104915777, filed on May 6, 2021, the contents of which are hereby incorporated by reference.

TECHNICAL FIELD

The present application relates to the technical field of preparation of high-temperature superconducting (HTS) strips, and in particularly to a second-generation HTS strip with a high-strength and high-conductivity stabilizing layer and a preparation method thereof.

BACKGROUND

With excellent material properties, the second-generation HTS materials have been widely studied and researched worldwide ever since being discovered. As a result, a significant progress has been made in applications such as superconducting energy storage, superconducting generators, superconducting power transmission, superconducting current limiters, superconducting magnets, etc. In the applications of superconducting magnets, engineering current density, tensile strength and electrical conductivity of HTS strips are key performance parameters that affect the manufacture and utilization of superconducting devices/apparatuses.

The second-generation HTS strip is developed based on a multi-layer coating technique, where silver and copper layers are deposited on the superconducting layer to prevent "quench" of the superconductivity of the superconducting layer caused by over-current. Mechanical properties of the second-generation HTS strip are mainly supported by a metal base strip, however, due to poor mechanical properties of the deposited silver and copper stabilizing layers, the overall mechanical properties of the second-generation HTS strip are significantly inferior to those of the metal base strip. Generally, the second-generation HTS strip is laminated so as to enhance the mechanical properties of the second-generation HTS strip, i.e, the strip is strengthened by high-strength metal lamination tapes. However, the second-generation HTS strip processed by this approach is strengthened at an expense of an engineering current density ($J_e$), which is required to be relatively high in application of high spatial locality (such as inserting magnets in a superconducting high field). Studies have shown that the higher the thickness of the silver and copper stabilizing layer, and the more obvious the decrease of the mechanical properties of the superconducting strip compared with the metal base band. Further, a problem of reduced $J_e$ due to a thicker stabilizing layer is particularly acute in the case of the HTS strip produced on a thin base strip (A. Sundaram, et al, SUST, 29 (2016) 104007).

Accordingly, a composite structure with a mechanically and electrically multifunctional and coordinated stabilizing layer is developed, which is important for improving the performance of the second-generation HTS strip and will increase the robustness of the second-generation HTS strip during applications.

SUMMARY

In response to the disadvantages in the related art, it is an objective of the present application to provide a second-generation HTS strip and a preparation method thereof.

The objective of the present application is achieved by the following technical scheme.

In one of the aspects of the present application, a second-generation HTS strip is provided, including a superconducting strip body and a stabilizing layer arranged on at least one side of the superconducting strip body, where the stabilizing layer is a copper-graphene composite film, and a mass fraction of graphene in the stabilizing layer is in a range from 0.1% to 1%.

In a preferred embodiment, a thickness of the stabilizing layer on one side of the superconducting strip body is in a range from 2 microns ($\mu$m) to 30 microns.

In a preferred embodiment, the graphene in the stabilizing layer is dispersed in the copper layer, or the graphene is continuously or discontinuously distributed in the form of a layer.

In a preferred embodiment, the superconducting strip body is an elongated strip with superconductivity and silver-plated surface. In a preferred embodiment, the elongated strip is a superconducting strip material containing a base band, a buffer layer, a superconducting layer and a silver layer.

In a preferred embodiment, a thickness uniformity of the stabilizing layer along a widthwise direction of the superconducting strip body reaches 99%, and edges of the superconducting strip body are completely wrapped by the stabilizing layer.

In a preferred embodiment, the stabilizing layer is deposited on one side or two opposite sides of the superconducting strip body by a copper-graphene double-target co-sputtering vapor deposition manner.

A method for papering the second-generation HTS strip is provided in a further aspect of the present application, including steps as follows:

(1) putting a superconducting strip body into a magnetron sputtering reaction chamber, pumping the magnetron sputtering reaction chamber to high-level vacuum and filling a working gas into the magnetron sputtering reaction chamber; and (2) using copper and graphene as targets, controlling a magnetron sputtering power and performing a sputter coating to deposit the targets onto at least one surface of the superconducting strip body and thereby obtaining the second-generation HTS strip with a copper-graphene structure generated thereon; wherein performing the sputter coating comprises performing a single-sided coating or a front and back sides coating on the at least one surface of the superconducting strip body.

In a preferred embodiment, a length of the superconducting strip body is in a range from 50 meters to 1,000 meters.

In a preferred embodiment, in step (1), the filled working gas is selected from the group of argon, methane and hydrogen, or a mixture of the three gases.

In a preferred embodiment, in the step (2), a water-cooled structure is involved in the coating process, where a coating temperature in the sputter coating process is no more than 200° C., and the performance of the superconducting strip after the coating is not attenuated.

Compared with the related art, the present application may have the following beneficial effects.

(1) The second-generation HTS strip developed by present application has a high strength and high conductivity stabilizing layer with tensile strength 30%-70% higher than that of strips with the same structure obtained by the conventional copper plating post-treatment process, where the conductivity attenuation of the second-generation HTS strip is less than 10% IACS (International Annealed Copper Standard); the present application solves the problem that the application of HTS strips is affected by the significant degradation of their mechanical and electrical properties caused by conventional post-treatment processes such as electrolytic copper plating and encapsulation.

(2) The second-generation HTS strip with high-strength and high-conductivity stabilizing layer structure of the present application is developed by utilizing the high strength and high conductivity of copper-graphene so as to improve the mechanical and electrical properties of the second-generation HTS strip; enhanced mechanical properties of superconducting strips comes from high tensile strength and enhanced electrical properties of second-generation high-temperature superconducting strips is resulted from the high electrical conductivity of the copper-graphene stabilizing layer, both of which expand the application areas of the material.

BRIEF DESCRIPTION OF DRAWINGS

Other features, objectives and advantages of the present application will become more apparent by reading the detailed description of non-limiting embodiments with reference to the following drawings, in which.

DETAILED DESCRIPTION OF EMBODIMENTS

The present application will be described in detail below with specific embodiments. The following embodiments will help those skilled in the art to further understand the present application, but do not limit the present application in any way. It should be pointed out that a number of changes and improvements could be made by ordinary technicians in this field without departing from the inventive concept. These modifications are all within the scope of protection of the present application. In addition, the present application relates to the schematic diagram of cross-sectional structure, and the thickness ratio of multi-layer materials is for convenience of explanation and does not represent the actual ratio.

The present application discloses a second-generation HTS strip with a structure of high strength and high conductivity stabilizing layer, where a copper-graphene thin film stabilizing layer is deposited on one or both sides of the second-generation HTS strip by a copper-graphene double-target co-sputtering vapor deposition method, and the second-generation HTS strip includes a metal base band, a buffer layer, a superconducting layer and a silver layer. The tensile strength covered by the present application refers to the 0.2% specified plastic elongation strength, tested with reference to the standard IEC 61788-25:2018 "Mechanical properties measurement—Room temperature tensile test on REBCO wires" developed by the International Electrotechnical Commission; the measurement of electrical conductivity is carried out in accordance with the China's national metrological specifications, namely JJF 1516-2015 "Calibration Specification for Electrical Conductivity Standards of Nonferrous Metals".

Embodiment 1

A second-generation HTS strip body, namely an elongated strip with superconductivity and silver-plated surface with a length of 500 m, is selected and placed in a magnetron sputtering reaction chamber (a roll-to-roll continuous coating device), the air is pumped out to a high-level vacuum, and then argon is filled in; copper and graphene are taken as the target materials; sputtering coating is started then to deposit target materials onto the surface of the second-generation HTS strip body to obtain the strip with high-strength and high-conductivity stabilizing layer with copper-graphene structure on the surface, where the stabilizing layer is plated on one side of the superconducting layer; a stabilizing layer with a graphene mass fraction of 0.3% is obtained by controlling the magnetron sputtering power, and graphene is uniformly dispersed in the copper layer; a stabilizing layer with a thickness of 30 µm is obtained by controlling the coating duration; during the coating process, the surface temperature of superconducting strip body is kept at 150° C. by controlling the water cooling device.

Figure 1:
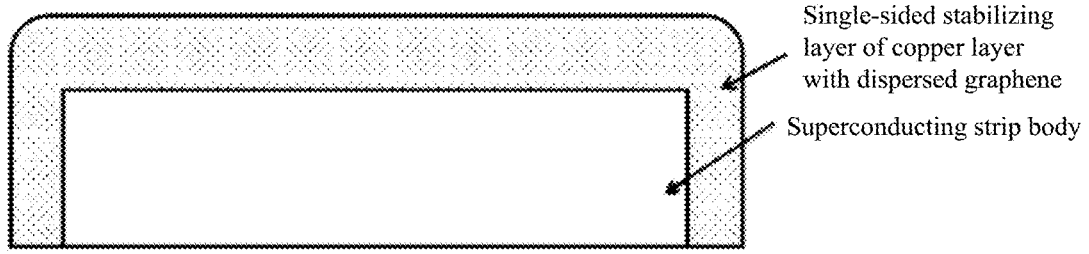
FIG. 1 shows a schematic cross-sectional structure diagram of an HTS strip prepared by the present application with one side coated with a stabilizing layer.

The stabilizing layer obtained by the above process has 99% thickness uniformity in the width direction of the second-generation HTS strip body and the entire edge of the second-generation HTS strip body is completely wrapped; a schematic diagram of the superconducting strip cross-section is shown in FIG. 1. Compared with the conventional electroplated copper strip with the same structure in Comparative Embodiment 1, the tensile strength of the second-generation HTS strip obtained by the above process is 1,500 MPa, and the conductivity attenuation is 5% IACS as shown in Table 1.

Embodiment 2

A second-generation HTS strip body, namely an elongated strip with superconductivity and silver-plated surface with a length of 1,000 m, is selected and placed in a magnetron sputtering reaction chamber (a roll-to-roll continuous coating device), the air is pumped out to a high-level vacuum, and then hydrogen is filled in; copper and graphene are taken as the target materials; sputtering coating is started then to deposit target materials onto the surface of the second-generation HTS strip body to obtain the strip with high-strength and high-conductivity stabilizing layer with copper-graphene structure on the surface, where the stabilizing layer is plated on one side of the superconducting layer; a stabilizing layer with a graphene mass fraction of 0.1% is obtained by controlling the magnetron sputtering power, and graphene is uniformly dispersed in the copper layer; a stabilizing layer with a thickness of 10 µm is obtained by controlling the coating duration; during the coating process, the surface temperature of superconducting strip body is kept at 200° C. by controlling the water cooling device.

The stabilizing layer obtained by the above process has 99% thickness uniformity in the width direction of the second-generation HTS strip body and the entire edge of the second-generation HTS strip body is completely wrapped; a schematic diagram of the superconducting strip cross-section is shown in FIG. 1. Compared with the conventional electroplated copper strip with the same structure in Comparative Embodiment 2, the tensile strength of the second-generation HTS strip obtained by the above process is 1,295 MPa, and the conductivity attenuation is 9% IACS as shown in Table 2.

Embodiment 3

A second-generation HTS strip body, namely an elongated strip with superconductivity and silver-plated surface with a length of 50 m, is selected and placed in a magnetron sputtering reaction chamber (a roll-to-roll continuous coating device), the air is pumped out to a high-level vacuum, and then methane is filled in; copper and graphene are taken as the target materials; sputtering coating is started then to deposit target materials onto the surface of the second-generation HTS strip body to obtain the strip with high-strength and high-conductivity stabilizing layer with copper-graphene structure on the surface, where the stabilizing layer is plated on both sides of the superconducting layer; a stabilizing layer with a graphene mass fraction of 0.1% is obtained by controlling the magnetron sputtering power, and graphene is uniformly layered in the copper layer; a stabilizing layer with a thickness of 2 μm is obtained by controlling the coating duration; during the coating process, the surface temperature of superconducting strip body is kept at 100° C. by controlling the water cooling device.

Figure 2:
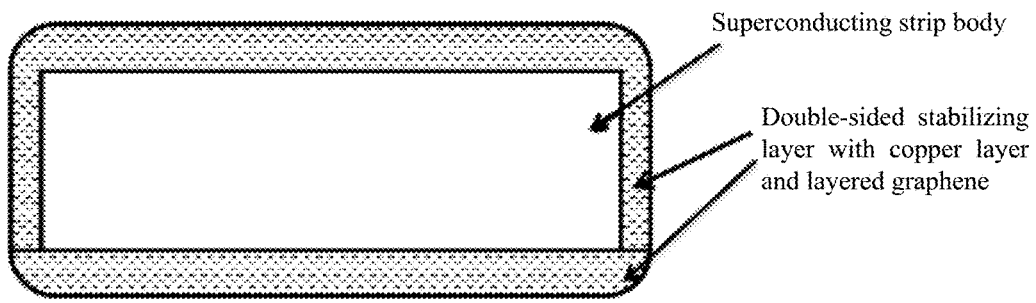
FIG. 2 shows a schematic diagram of the cross-sectional structure of the HTS strip prepared by the present application with both sides coated with stabilizing layer.

The stabilizing layer obtained by the above process has 99% thickness uniformity in the width direction of the second-generation HTS strip body and the entire edge of the second-generation HTS strip body is completely wrapped; a schematic diagram of the superconducting strip cross-section is shown in FIG. 2. Compared with the conventional electroplated copper strip with the same structure in Comparative embodiment 3, the tensile strength of the second-generation HTS strip obtained by the above process is 1,220 MPa, and the conductivity attenuation is 2% IACS as shown in Table 2.

Comparative Embodiment 1

A second-generation HTS strip body, i.e., an elongated strip with superconductivity and a silver-plated surface, with a length of 500 m, is placed in a copper plating bath (a roll-to-roll continuous plating device) to deposit copper onto the surface of the second-generation HTS strip body, resulting in a strip with a stabilizing layer of pure copper structure on the surface, where the stabilizing layer is plated onto one side of the superconducting layer; a pure copper stabilizing layer with a thickness of 30 μm on one side is obtained by controlling the travel speed of strip and voltage.

Figure 3:
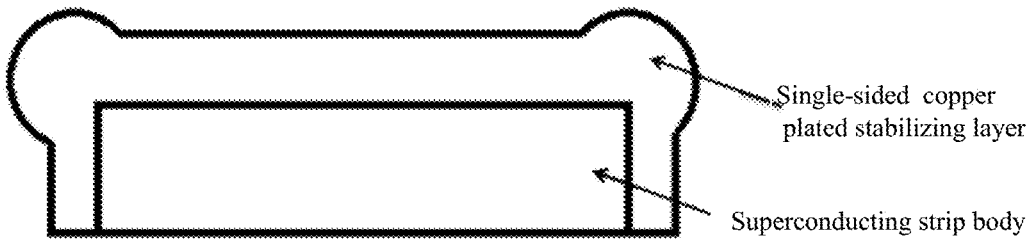
FIG. 3 illustrates a schematic diagram of the cross-sectional structure of the conventional single-sided electroplated copper superconducting strip prepared in Comparative embodiment 5.

The thickness uniformity of the stabilizing layer along the width of the second-generation HTS strip body is 70%, and all edges of the second-generation HTS strip body are completely wrapped using the above process; the cross-sectional diagram of the superconducting strip is shown in FIG. 3. The tensile strength of the second-generation HTS strip obtained by the above process is 880 Mpa with no attenuation in electrical conductivity as shown in Table 1.

Comparative Embodiment 2

As in Embodiment 1, a stabilizing layer with high strength and high conductivity is prepared on the surface of the second-generation HTS strip body, with the difference that a stabilizing layer with a graphene mass fraction of 5% is obtained by controlling the magnetron sputtering power.

The thickness uniformity of the stabilizing layer along the width of the second-generation HTS strip body reaches 99%, and all edges of the second-generation HTS strip body are completely wrapped using the above process; the cross-sectional diagram of the superconducting strip is shown in FIG. 1. The second-generation HTS strips obtained using the above process achieves a tensile strength of 1,090 MPa and an electrical conductivity attenuation of 32% IACS compared to the superconducting strips of the same structure in Embodiment 1, as shown in Table 1.

Comparative Embodiment 3

The same process as in Embodiment 1 is adopted in the present comparative embodiment to prepare a high-strength and high-conductivity stabilizing layer on the surface of a second-generation HTS strip body, with the difference that after pumping to a high-level vacuum and filling with nitrogen, the strip with a copper nitride-copper carbide-copper structure stabilizing layer is generated on the surface.

The thickness uniformity of the stabilizing layer along the width of the second-generation HTS strip body is 99% and the edge of the second-generation HTS strip body is fully wrapped using the above process; the cross-sectional schematic of the superconducting strip is shown in FIG. 1. The second-generation HTS strip obtained by the above process achieves a tensile strength of 900 MPa with a 14% IACS attenuation in electrical conductivity compared to the superconducting strip of the same structure as in Embodiment 1, as shown in Table 1.

TABLE 1

Comparison of electrical and mechanical properties of superconducting strips in Embodiment 1 and Comparative embodiments 1, 2 and 3

|  | Embodiment 1 | Comparative embodiment 1 | Comparative embodiment 2 | Comparative embodiment 3 |
| --- | --- | --- | --- | --- |
| Tensile strength (MPa) | 1,500 | 880 | 1,090 | 900 |
| Conductivity attenuation (% ICAS) | 5% | 0 | 32% | 14% |

As can be seen from Table 1, the tensile strength of Comparative Embodiment 1 is lower than that of Embodiment 1, which is mainly due to the fact that the mechanical properties of the high strength and high conductivity stabilizing layer of the copper-graphene structure of Embodiment 1 are significantly better than those of the pure copper stabilizing layer of Comparative embodiment 1; the tensile strength of Comparative embodiment 1 is better than that of Comparative embodiment 2 as a result of the high graphene content of Comparative embodiment 2, which instead has a lower tensile strength; and the tensile strength Comparative embodiment 1 is better than that of Comparative embodiment 3 since Comparative embodiment 3 has no copper-graphene structure. The conductivity degradation of Embodiment 1 is lower than that of Comparative embodiments 2 and 3 due to the application of the optimized copper-graphene structure and the optimized graphene content; the conductivity degradation of Embodiment 1 is slightly higher than that of Comparative embodiments 1 in that the preferred copper-graphene structure has conductivity slightly inferior to pure copper.

Comparative Embodiment 4

The same process as in Embodiment 1 is adopted to prepare a high-strength and high-conductivity stabilizing layer on the surface of the second-generation HTS strip body, except that in the coating process, the surface temperature of the superconducting strip body is kept at 250° C. by controlling the water-cooling device.

The current of that second-generation HTS strip with stabilizing layer obtain by the above-mentioned process is greatly attenuated.

Comparative Embodiment 5

A second-generation HTS strip with a stabilizing layer, the structure of which is shown in FIG. 3, differs from Embodiment 2 in that it is prepared by placing an elongated strip with a superconducting surface coated with silver into a copper plating bath (a roll-to-roll continuous plating device) and depositing copper on the surface of the second-generation HTS strip body, resulting in a strip with a stabilizing layer of pure copper structure on the surface. What is identical to Embodiment 2 is that the stabilizing layer is plated on one side of the superconducting layer, the length is 1,000 m and the thickness is 10 μm.

The thickness uniformity of that stabilizing lay obtained by the above process along the width direction of the second-generation HTS strip body is 70%, and the edges of the second-generation HTS strip body are completely wrapped; it can be seen from Table 2 that the tensile strength of that second-generation HTS strip obtained by the above process is 920 MPa and the conductivity is not attenuated.

Comparative Embodiment 6

Figure 4:
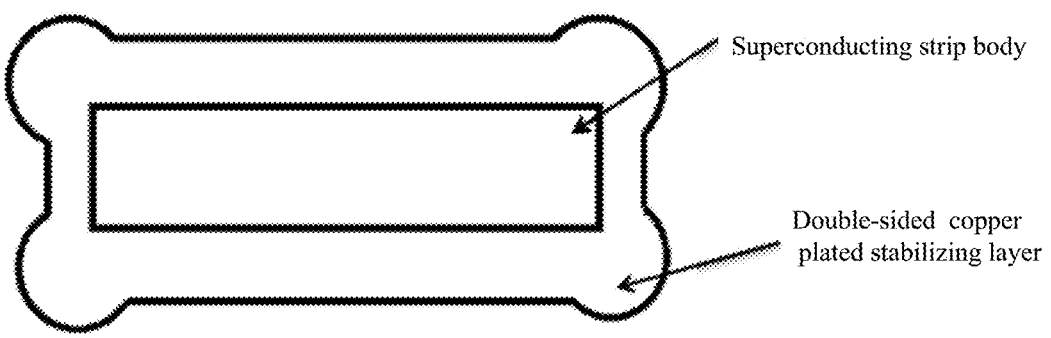
FIG. 4 shows a schematic cross-sectional structure diagram of the traditional double-sided electroplated copper superconducting strip prepared in Comparative embodiment 6.

A second-generation HTS strip with a stabilizing layer, the structure of which is shown in FIG. 4, differs from Embodiment 3 in that it is prepared by placing an elongated strip with a superconducting surface coated with silver into a copper plating bath (a roll-to-roll continuous plating device) and depositing copper onto the surface of the second-generation HTS strip body, resulting in a strip with a stabilizing layer of pure copper structure developed on the surface. What is identical to Embodiment 3 is that the stabilizing layer is plated on both sides of the superconducting layer with a length of 50 m by controlling the thickness of the strip to 2 μm on one side and 4 μm in total.

The thickness uniformity of that stabilizing lay obtained by the above process along the width direction of the second-generation HTS strip body is 70%, and the edges of the second-generation HTS strip body are completely wrapped; the schematic cross-sectional view of superconducting strip is shown in FIG. 4. It can be seen from Table 2 that the tensile strength of that second-generation HTS strip obtained by the above process is 925 MPa and the conductivity is not attenuated.

TABLE 2

Comparison of electrical and mechanical properties of superconducting strips in Embodiments 2 and 3 and Comparative embodiments 5 and 6

|  | Embodiment 2 | Comparative embodiment 5 | Embodiment 3 | Comparative embodiment 6 |
|---|---|---|---|---|
| Tensile strength (MPa) | 1295 | 920 | 1220 | 925 |
| Conductivity attenuation (% ICAS) | 9% | 0 | 2% | 0 |
| Thickness uniformity of strip | 99% | 70% | 99% | 70% |

As can be seen from Table 2, the tensile strength and thickness uniformity of strip in Comparative embodiment 5 are both lower than those in Embodiment 2, which is mainly due to the fact that Comparative embodiment 5 uses a conventional process of electrolytic copper plating; in this process, an uneven thickness structure is formed due to the concentration of the electric field at the edge of the strip, resulting in fast copper plating at the edge; also, the high strength and high conductivity stabilizing layer of the copper-graphene structure used in Embodiment 2 makes the mechanical properties of Embodiment 2 significantly better than those of the pure copper stabilizing layer of Comparative embodiment 5.

The attenuation ratio of conductivity of Embodiment 2 is slightly higher than that of Comparative embodiment 5 in that the conductivity of preferred copper-graphene structure in Embodiment 2 is slightly lower than that of pure copper in Comparative embodiment 5.

As can be seen by comparing Comparative embodiment 6 with Embodiment 3, the tensile strength and strip thickness uniformity of Comparative embodiment 6 is lower than that of Embodiment 3, and the conductivity attenuation of Comparative embodiment 6 is lower than that of Embodiment 3, which are for the same reason as above.

Specific embodiments of the present application have been described above. However, it is to be understood that the present application is not limited to the specific embodiments described above and that various variations or modifications may be made by a person skilled in the art within the scope of the claims, which do not affect the essence of the present application. The embodiments and features in the embodiments of the present application may be combined with each other in any way on the prerequisite of no conflict.

What is claimed is:

1. A second-generation high-temperature superconducting (HTS) strip, comprising: a superconducting strip body and a stabilizing layer arranged on at least one side of the superconducting strip body; wherein the stabilizing layer is a copper-graphene composite film, and a mass fraction of graphene in the stabilizing layer is in a range from 0.1% to 1%;
    wherein the graphene is dispersed in a copper layer of the stabilizing layer, or the graphene is discontinuously distributed in the form of a layer;
    wherein the stabilizing layer is deposited on one side or two opposite sides of the superconducting strip body by a copper-graphene double-target co-sputtering vapor deposition method through a sputter coating process;
    wherein a coating temperature does not exceed 200° C. in the sputter coating process.

2. The second-generation HTS strip according to claim 1, wherein a thickness of the stabilizing layer on one side of the superconducting strip body is in a range from 2 microns to 30 microns.

3. The second-generation HTS strip according to claim 1, wherein the superconducting strip body is an elongated strip with superconductivity and a silver-plated surface.

4. The second-generation HTS strip according to claim 1, wherein a thickness uniformity of the stabilizing layer along a widthwise direction of the superconducting strip body reaches 99%, and edges of the superconducting strip body are completely wrapped by the stabilizing layer.

* * * * *